METHOD OF PRODUCING A PROTECTIVE LAYER OF $SiO_2$ ON THE SURFACE OF A SEMICONDUCTOR WAFER
Filed June 25, 1970
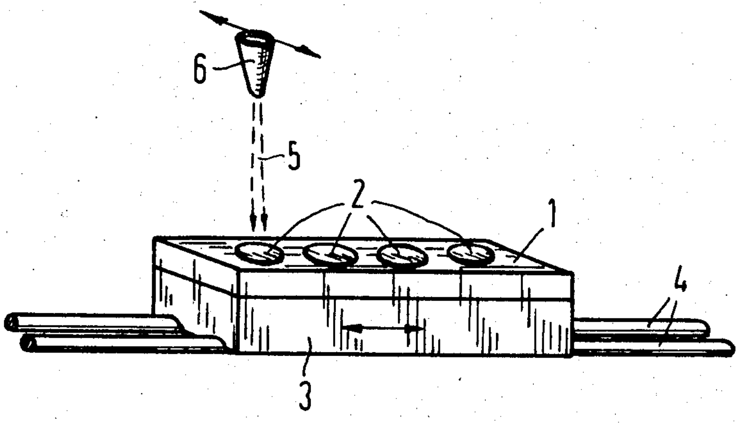

United States Patent Office 3,681,132
Patented Aug. 1, 1972

3,681,132

METHOD OF PRODUCING A PROTECTIVE LAYER OF $SiO_2$ ON THE SURFACE OF A SEMICONDUCTOR WAFER

Erich Pammer and Peter Heidegger, Munich, Germany, assignors to Siemens Aktiengesellschaft, Berlin, Germany Filed June 25, 1970, Ser. No. 49,618
Claims priority, application Germany, July 2, 1969, P 19 33 664.2
Int. Cl. C23c *13/02;* C23f *7/02;* H01b *1/08*
U.S. Cl. 117—201 4 Claims

ABSTRACT OF THE DISCLOSURE

A gas jet of $SiH_4$ and inert gas is passed over heated semiconductor wafers on a substrate and thickly coats the substrate in the area of the wafers, simultaneously causing oxygen to act on the wafers to provide a homogeneous layer of $SiO_2$ on the wafers.

The invention relates to a method of producing a protective layer of $SiO_2$ on the surface of a semiconductor wafer. More particularly, the invention relates to a method of coating semiconductor wafers of monocrystalline silicon, germanium, or $A^{III}B^{V}$ compounds with a homogeneous layer of $SiO_2$. The semiconductor wafers are heated and subjected to a reaction gas suitable for precipitating $SiO_2$.

Silicon crystals are usually coated with $SiO_2$ layers by means of thermal oxidation. This is accomplished by heating the crystal in an oxidizing medium such as oxygen or hydrogen, for example. In order to provide a sufficient thickness of the layer of $SiO_2$, however, the surface of the semiconductor must be heated to relatively high temperatures, far in excess of 500° C. For this reason, the production of $SiO_2$ protective layers on completed semiconductor components is not advisable, due to the possibility of subsequent indiffusion of dopants.

It is usual, especially during the production of protective layers on germanium or $A^{III}B^{V}$ compounds, to precipitate the $SiO_2$ from a reaction gas. Easily volatile siloxanes or silicic acid esters are utilized to accomplish this. These are evaporated, mixed with an inert gas, and applied to the heated semiconductor wafers to be coated. Since these compounds contain silicon and oxygen at the same time, the desired $SiO_2$ occurs by pyrolytic dissociation, without the necessity for supplying the reaction gas with an agent which effects the oxidation.

In order to provide adequate adhesion of the $SiO_2$ layers to the substrate, the substrate must be heated to very high temperatures of, for example, 600 or 700° C. This also provides sufficient protection against undesired penetration of dopant material when the layers are utilized for diffusion masking. Furthermore, reaction gases are not always indicated when extremely uniform layers are to be produced, since there is a possibility that traces of foreign matter such as, for example, SiC, will be included in the resultant $SiO_2$ layer. This results in the aforementioned inhomogeneties.

The principal object of the invention is to provide a new and improved method of producing a protective layer of $SiO_2$ on the surface of a semiconductor wafer.

An object of the invention is to provide a simple method for producing a heavy protective layer of $SiO_2$ on the surface of a semiconductor wafer.

An object of the invention is to provide a method of producing a protective layer of any desired thickness of $SiO_2$ on the surface of a semiconductor wafer.

An object of the invention is to provide a method of producing a protective layer of $SiO_2$ on the surface of a semiconductor wafer, which method is efficient, effective and reliable.

The method of the invention provides extremely uniform $SiO_2$ layers by the use of the aforedescribed method.

In accordance with the invention, a gas jet is passed across semiconductor wafers arranged on a substrate and heated to a maximum of 500° C. The gas jet comprises $SiH_4$ and inert gas, so that the substrate is thickly coated in the area of the semiconductor wafers by the gas jet. Simultaneously, oxygen is caused to act on the heated semiconductor wafers.

It is essential that the gas jet retain its direction, so that it impinges upon the substrate and semiconductor wafers at a constant angle. The angle of impingement is preferably 90°. Inert gases which may be utilized in the gas jet are nitrogen, argon, and other noble gases. The inert gases represent the greatest portion of the reaction gas directed against the wafers to be coated. The $SiH_4$ content of the gas jet is provided at a maximum of 1 vol. percent. The semiconductor surfaces to be coated are heated to a minimum of 200° C. and a maximum of 500° C. Optimum conditions are provided at 450 to 500° C.

The gas jet is passed across the semiconductor wafers to be coated at a speed of 1 cm. per second. The gas jet preferably flows from a nozzle which is maintained constantly vertical and directed downward. The distance of the nozzle from the substrate is maintained small enough so that the gas impinges as a jet upon said substrate and the semiconductor wafers.

A reservoir of pure oxygen may be utilized to provide the oxygen required for oxidation. The processing vessel or container is preferably maintained unsealed or open so that oxygen in the air may be utilized in the process. The oxygen in the air thus provides the oxygen required for oxidation.

The method of the invention provides a heavy, dense, or thick layer of $SiO_2$ on semiconductor wafers and thereby protects such semiconductor wafers. The $SiO_2$ layers are also utilized for diffusion masking and may be provided at any desired thickness, preferably between 100 and 25,000 A. The constancy or uniformity of the thickness of the $SiO_2$ layer depends upon the uniformity with which the gas is passed across the substrate and may be readily adjusted to tolerances of less than 5%, and especially less than 2%. The uniformity of the thickness of the $SiO_2$ layer also depends upon the uniformity of the gas supply. It is therefore preferable to utilize special regulating gas valves.

In order that the invention may be readily carried into effect, it will now be described with reference to the accompanying drawing, wherein the single figure illustrates an embodiment of a device for accomplishing the method of the invention.

The device of the figure may also be utilized as a continuous heating furnace.

In the figure, a substrate 1 of the heat resistant metal such as, for example, V2A steel, is designed as an electric heating plate by known means, not shown in the figure. A plurality of semiconductor crystals or wafers 2 rest on the upper surface of the substrate 1. The semiconductor crystals 2 are to be coated with a layer of $SiO_2$.

The substrate 1 is mounted on a carriage, cart, or the like 3 which is moved linearly at uniform speed on a pair of guide rails 4. A nozzle 6 is provided above the substrate 1 at a distance which insures that a gas jet flowing from said nozzle will impinge upon said substrate as a jet. The nozzle 6 is mounted in a manner, indicated by the double arrows and not shown in the figure in order to maintain the clarity of illustration, which permits it to be moved back and forth across the substrate 1 without changing the distance of said nozzle from said substrate. This may be accomplished by a cam and linear guide arrangement, as known in the art.

It is important that the speed of movement of the nozzle 6 be uniform during the time that a gas jet 5 flowing therefrom is directed against the semiconductor wafers 2 being coated. The speed of movement of the carriage 3 and of the nozzle 6 are adjusted to each other and to the cross-section of the gas jet 5 in a manner whereby said gas jet impinges upon the substrate 1 and the semiconductor wafers 2 and said substrate and semiconductor wafers are uniformly and compactly brushed or passed over by said gas jet.

The temperature may be controlled by any suitable means such as, for example, thermoelements. The oxygen required for oxidation is preferably provided by the atmospheric air. The air is available in sufficient volume if the vessel or container of the device is open to the air.

The homogeneity of the $SiO_2$ coat or deposit may be ascertained by observation of discolorations or the occurrence of interference colors.

While the invention has been described by means of a specific example and in a specific embodiment, we do not wish to be limited thereto, for obvious modifications will occur to those skilled in the art without departing from the spirit and scope of the invention.

We claim:

1. A method of coating semiconductor wafers with a uniform layer of $SiO_2$ which comprises heating said semiconductor wafers, which are situated on a heated substrate, to a temperature of at least 200° C., and at most 500° C., exposing said heated substrate to a reaction gas current of $SiH_4$ and inert gas with a maximum 1 vol.-percent $SiH_4$, said reaction gas being guided by a nozzle perpendicularly against said semiconductor wafers, maintaining a small but constant distance between the nozzle, which produces the reaction gas current and the semiconductor wafers, so that the reaction gas arrives in the vicinity of the semiconductor wafers in form of a jet, despite the presence of an oxygen containing atmosphere which is insured by the admittance of air and which effects the occurrence of $SiO_2$ on the wafer surface, and guiding the point of impingement uniformly and densely across the surface of the semiconductor wafers.

2. A method as claimed in claim 1, wherein the content of $SiH_4$ in the gas mixture of $SiH_4$ and inert gas is adjusted to 0.5 to 0.8 vol. percent.

3. A method as claimed in claim 1, wherein the temperature of the semiconductor wafers is adjusted to 450° C.

4. A method as claimed in claim 1, wherein said semiconductor wafers consist of one of the group consisting of monocrystalline silicon, germanium and $A^{III}B^{V}$ compounds.

References Cited

UNITED STATES PATENTS

| | | | |
|---|---|---|---|
| 3,304,200 | 2/1967 | Statham | 117—201 |
| 3,114,663 | 12/1963 | Klerer | 117—201 X |
| 3,055,776 | 9/1962 | Stevenson et al. | 117—212 |
| 3,507,766 | 4/1970 | Cunningham et al. | 117—93.1 |

WILLIAM L. JARVIS, Primary Examiner

U.S. Cl. X.R.

117—106 A